(12) United States Patent
Chakraborty et al.

(10) Patent No.: US 11,544,037 B2
(45) Date of Patent: Jan. 3, 2023

(54) LOW AREA MULTIPLY AND ACCUMULATE UNIT

(71) Applicant: International Business Machines Corporation, Armonk, NY (US)

(72) Inventors: Sudipto Chakraborty, Plano, TX (US); Rajiv Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 16/862,722

(22) Filed: Apr. 30, 2020

(65) Prior Publication Data

US 2021/0342121 A1    Nov. 4, 2021

(51) Int. Cl.
*G06F 7/544* (2006.01)
*G06G 7/16* (2006.01)

(52) U.S. Cl.
CPC ............. *G06F 7/5443* (2013.01); *G06G 7/16* (2013.01)

(58) Field of Classification Search
CPC ............ G06G 7/16; G06F 7/5443; G06J 1/00; H03M 1/66; H03M 1/74; G11C 7/1006; G11C 11/54; G11C 11/16; G11C 13/0002; G11C 13/0004
See application file for complete search history.

(56) References Cited

U.S. PATENT DOCUMENTS

| | | |
|---|---|---|
| 10,007,517 B2 | 6/2018 | Buchanan et al. |
| 10,180,820 B2 | 1/2019 | Buchanan et al. |
| 10,318,242 B2 | 6/2019 | Swartzlander et al. |

(Continued)

OTHER PUBLICATIONS

A. J. Lopez-Martin, C. A. De La Cruz Bias, J. Ramirez-Angulo and R. G. Carvajal, "Compact low-voltage CMOS current-mode multiplier/divider," 2010 IEEE International Symposium on Circuits and Systems (ISCAS), 2010, pp. 1583-1586, doi: 10.1109/ISCAS.2010.5537427. (Year: 2010).*

Umesh et al., "A survey of spintronic architectures for processing-in-memory and neural networks," Journal of Systems Architecture, vol. 97, Aug. 2019, pp. 349-372.

(Continued)

*Primary Examiner* — Matthew D Sandifer
*Assistant Examiner* — Huy Duong
(74) *Attorney, Agent, or Firm* — Scully, Scott, Murphy & Presser, P.C.; Daniel P. Morris

(57) ABSTRACT

An improved electronic mixed mode multiplier and accumulate circuit for artificial intelligence and computing system applications that perform vector-vector, vector-matrix and other multiply-accumulate computations. The circuit is provided is a high resolution, high linearity, low area, low power multiply—accumulate (MAC) unit to interface with a memory device for storing computation output results. The MAC unit uses a less number of current carrying elements resulting in much lower integrated circuit area, and provides a tight matching between the current elements thus preserving inherent linearity requirements due to current mode operation. Further the MAC performs current scaling using switches and current division where the current switches occupy minimum size transistors requiring a small area to implement that renders it compatible with MRAM such as a magnetic tunnel junction device. The MAC is hierarchically extended for increased number of bits to provide a delay implementation using orthogonal vector and current addition.

20 Claims, 8 Drawing Sheets

(56) References Cited

U.S. PATENT DOCUMENTS

| | | |
|---|---|---|
| 10,848,167 B1 * | 11/2020 | Far .................. H03M 1/0604 |
| 2019/0080230 A1 | 3/2019 | Hatcher et al. |
| 2019/0108193 A1 | 4/2019 | Buchanan |
| 2019/0131977 A1 | 5/2019 | Obradovic et al. |
| 2019/0181338 A1 | 6/2019 | Hashemi et al. |
| 2019/0236445 A1 | 8/2019 | Das et al. |

OTHER PUBLICATIONS

Hoskins et al., "Streaming Batch Eigenupdates for Hardware Neural Networks," Frontiers in Neuroscience, vol. 13, Article 793, Aug. 6, 2019, 9 pp.

* cited by examiner

LOW AREA MULTIPLY AND ACCUMULATE UNIT

BACKGROUND

The present disclosure relates to improvements in mixed mode multipliers for use in Artificial Intelligence (AI) and computing systems and particularly to an electronic circuit configured to perform vector-matrix or multiply-accumulate computations.

Machine learning is the cornerstone of Artificial Intelligence applications where deep learning techniques are implemented by a computing system organized as a neural network for example to compute statistical likelihoods of matching input data with prior computed data. In neural network configuration, a plurality of interconnected processing nodes enables the analysis of data to compare an input to training data.

Trained data refers to computational analysis of properties of known data to develop models to use to compare the input data. One example of an application of AI and data training is found in object recognition. Neural networks compute "weights" to perform computation on new data (an input data "word") and use multiple layers of computational nodes, where deeper layers perform computations based on results of computations performed by higher layers.

Current machine learning techniques rely on the computation of matrix multiplications, vector-matrix operations, dot-products and absolute difference of vectors that are typically computed with multiply and accumulate (MAC) operations performed on input data and weights. A MAC unit performs both multiply and addition functions by first operating to compute the product of given numbers and then forward the result for addition or accumulation.

As AI machine learning in large and deep neural networks is very computationally intensive and typically involves a processor to compute and compare many different data elements, they are usually stored in a non-volatile memory element. For AI computations however, the transfer of data becomes a major bottleneck and as the data sets increase, the time and energy consumed by a computing system for moving data also significantly increases.

One processor element in particular is the Multiplier-accumulator (MAC) unit that supports execution of a large number of digital signal processing for AI applications. MAC, being an execution unit in a processor, implements an arithmetic architecture which processes operands, e.g., 16-bit, 32-bit, etc., for supporting functions such as signed and unsigned integer multiplications and multiply-accumulate operations, with data inputs and outputs stored in memory.

As shown in FIG. 1, a MAC unit is formed of a multiplication engine and an accumulator adder, the multiplication engine performing a multiply operation using data received from a memory element and generating a multiplication output based on an operand bits from a received memory element output and another received operand signal and an accumulation engine to sum multiplication outputs from the number of multiplication engines which output is stored in a memory element.

In conventional implementations, current steering digital-to-analog converters (DACs) are typically used for high speed, low latency circuits. Current steering DACs use a plurality of current mirrors (base sources) that are hard switched in one of the two directions (for 1024 (=2$^{10}$) levels base=10 current sources for binary, and base=1024 current sources for unary). For higher number of bits, extensive calibration is needed due to the mismatch in the base current source. Additionally, for higher number of bits, a ratio between the MSB and LSB increases exponentially with number of bits. Thus, area of the DAC increases as the number of current source increases.

The prior art MAC unit depicted in FIG. 1 shows a binary weighted current steering DAC architecture 10 that converts a differential N-bit digital signal, e.g., bits $b_0, b_1, \ldots b_{n-1}$, to an analog current, i.e., differential outputs $I_{out+}$ 30 and $I_{out-}$ 40. The typical current-steering DAC circuit architecture 10 shown in FIG. 1 is a binary weighted current steering DAC having an array 20 of N binary-weighted elements, i.e., binary weighted current sources $12_1, 12_2, 12_3, \ldots, 12_N$, etc. corresponding to respective bits $b_0, b_1, \ldots b_{N-1}$, where N is the DAC resolution. From left to right, each current source $12_1, 12_2, 12_3, \ldots, 12_N$, etc. of the binary weighted current sources 20 shown in FIG. 1 depicts a cascode connection of binary weighted transistors, e.g., PMOS transistors M1, M2 representing a respective current source transistor 15 for current source matching and a cascode connected transistor 16 for providing high output impedance, where the current source transistor 15 includes source terminal connected to a fixed power supply voltage $V_{DD}$. A biasing voltage $V_B$ is provided for each current source transistor 15 and a biasing voltage $V_{BC}$ is for biasing each cascode transistor 16.

For proper matching among the current sources, the current sources $12_1, 12_2, 12_4, \ldots, 12_N$, are binary weighted meaning that each source (e.g., from left to right) are scaled up by a factor of two from one bit to the next. For example, as shown in FIG. 1, a "unit" current source cell 12 includes a cascode connected (M1, M2) transistor current source to provide a unit current value. The first current source $12_1$ corresponds to a bit $b_0$, and from left to right, each successive current source, e.g., $12_2, 12_3, \ldots, 12_N$ is binary weighted by larger cells, each larger cell providing a current multiplication. That is, the second cell providing current source $12_2$ corresponding to bit $b_1$ has 2 unit cells in parallel, the third cell providing current source $12_3$ corresponding to bit $b_2$ has 4 unit cells in parallel and the $N^{th}$ current source $12_N$ has $2^{(N-1)}$ unit cells in parallel to provide a current multiplication. Thus, for the eighth bit of an eight-bit (N=8) current steering DAC, its corresponding binary weighted current source $12_N$ has a weight of 128 unit cells (transistors) providing the current multiplication. The outputs of the current sources are combined to provide an analog output, e.g., differential output currents 30, 40.

As further shown in FIG. 1, each binary weighted current source, e.g., current sources $12_1, 12_2, 12_3, \ldots, 12_N$ is connected to a respective differential-pair transistor set 25 including MOS switching transistors M3, M4, e.g., PMOS transistors each of a minimum size, where each respective differential-pair transistors receive differential input bits to control a current that is binarily weighted with respect to the unit current value. For example, as shown in FIG. 1, current source $12_1$ corresponds to the least significant bit (LSB), with its connected differential-pair transistor set 25 receiving differential pair of input bits $b_0, /b_0$, current source $12_2$ corresponds to the next least significant input differential bits pair $b_1, /b_1$ and current source $12_N$ corresponds to the most significant bit (MSB) differential input bits pair $b_{N-1}, /b_{N-1}$. At each connected differential-pair transistor set, the source (or sink) current passes through only one level switching transistors, and current is steered either to the left as $I_{out+}$ 30 or right as $I_{out-}$ 40 by each differential-pair transistor set.

Thus, it is seen that binary weighted current source transistors unit cells 12 (having cascode connected transistors M1, M2) do not scale with technology: i.e., the binary weighted current source transistors are typically dependent on overdrive and current density, and consumes large area. Due to the large size of the current source transistors, increasing the number of bits leads to increased digital routing and power consumption. However, the differential-pair switches M3, M4 are typically smaller in size, and scales with technology.

Thus, array size is limited by current source size, which increases digital routing. Further, extensive calibration is required to achieve better linearity. Hence, the conventional binary weighted current steering DAC is not efficient for power and area, and are not scalable for AI applications.

BRIEF SUMMARY

In an aspect of the present disclosure, there is provided a high resolution, high linearity, low area, low power multiply—accumulate (MAC) unit to interface with a memory device.

In an aspect of the present disclosure, there is provided a high resolution, high linearity, low area, low power MAC that provides current directly to a MRAM memory device configured for AI applications.

The high resolution, high linearity, low power MAC uses a less number of current sources resulting in much lower area, and provides a tight matching between the current sources thus preserving inherent linearity requirements due to current mode operation.

Further to this aspect, the high resolution, high linearity, low power MAC performs current scaling using switches and current division where the current switches occupy minimum size transistors requiring a small area to implement that renders it compatible with MRAM.

In an embodiment, the high resolution, the high linearity, low power MAC is hierarchically extended for higher number of bits. This provides a delay implementation using orthogonal vector and current addition.

In a further aspect of the present disclosure, there is provided a low power, high resolution MAC that alleviates a low Ron/Roff issue in MRAM memory configurations.

In accordance with one embodiment, there is provided an electronic device comprising: a plurality of current sources, each current source of a uniform size to each provide a matched current output; one or more current splitters, a current splitter coupled to one current source of the plurality for receiving a matched current output from its coupled current source, each current splitter comprising a series of weighted switching transistor structures, each respective weighted switching transistor of the series configured for dividing current received from its coupled current source according to a weighting scheme, a respective weighted switching transistor of the series further receiving a respective bit of an input digital word to be multiplied, a respective bit controlling a current flow at a respective path of that respective switching transistor from the input current source; and an output conductor connected to an output of each weighted switching transistor of the series for accumulating each current flow output of a respective path of the series of weighted switching transistors of a current splitter as controlled by the respective input digital word bits, the accumulated current flow output representing an analog current representation of the first input digital word.

In accordance with a further embodiment, there is provided an electronic device comprising: a plurality of current sources, each current source of a uniform size to each provide a matched current output; a first current splitter and a second current splitter each first and second current splitter coupled with respective first matched current source and a second matched current source, the first and second current splitters comprising a first hierarchy current scaling network, the first current splitter having a first series of weighted switching transistor structures receiving a first input digital word to be multiplied and the second current splitter having a second series of weighted switching transistor structures receiving a second input digital word to be multiplied, each respective weighted switching transistor of the first series configured for dividing current received from its coupled current source according to the weighting scheme to provide a first multiplication path current flow output of the first current splitter, and each respective weighted switching transistor of the second series configured for dividing current received from its coupled current source according to the weighting scheme to provide a second multiplication path current flow output of the second current splitter; a first output conductor receiving the first multiplication path current flow output; a second output conductor receiving the second multiplication path current flow output; and a second hierarchy current scaling network connected to the first hierarchy current scaling network, the second hierarchy current scaling network comprising: third and fourth current splitters, the third current splitter coupled with the first output conductor, and the fourth current splitter coupled with the second output conductor.

BRIEF DESCRIPTION OF THE DRAWINGS

The details of the present disclosure, both as to its structure and operation, can be understood by referring to the accompanying drawings, in which like reference numbers and designations refer to like elements.

DETAILED DESCRIPTION

The present disclosure relates to improvements in MAC circuits for deep learning/AI applications, and particularly multiplication engines to perform a multiply operation using data such as received from a memory element and generating a multiplication/accumulation output based on a received memory element output and a received signal and an accumulation. The array also includes an accumulation engine to sum multiplication outputs from the number of multiplication engines.

Figure 2A:
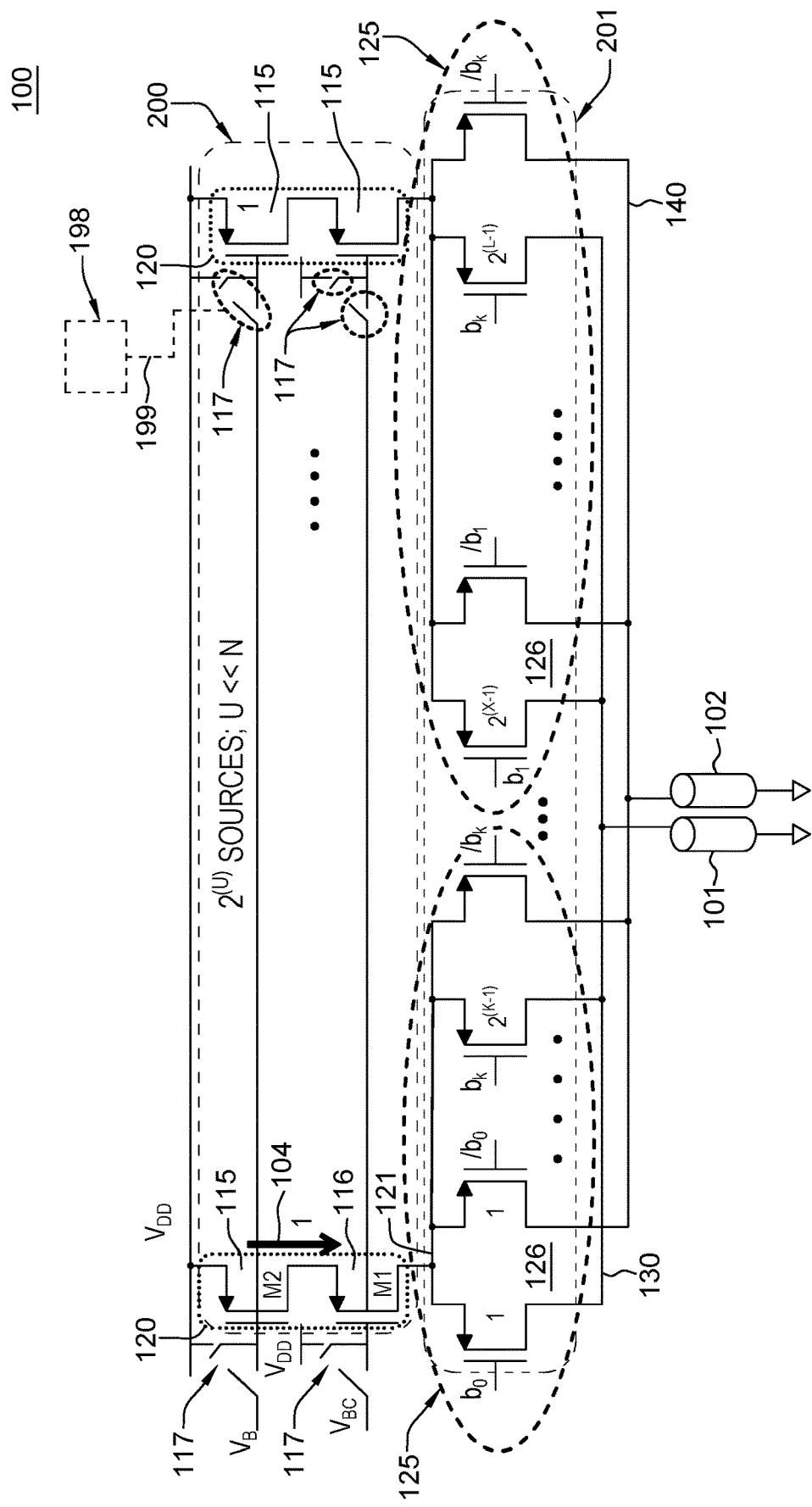
FIG. 2A is a circuit schematic depicting a high resolution, high linearity, low area, low power current steering unit for a DAC/MAC that employs current division and uses a significantly less number of current sources according to an embodiment.

FIG. 2A depicts a low area multiply and accumulate unit according to an embodiment that includes an electronic current steering unit 100 for a DAC or MAC unit that employs a fewer number of current sources or current carrying elements 120 and consequently provides less constraint on current matching, and consumes much reduced integrated circuit area. In an embodiment, current steering unit 100 could provide a digital to analog converter function or alternately function as a mixed mode multiplier unit in which analog variable (current provided by a current source or current carrying element 120) are multiplied by a digital word of bits $b_0, b_1, b_2, \ldots, b_k$ where the analog variable current through current source 120 is an analog current representing an analog variable from a previous state (e.g., from a prior node of a neural network) and a digital word can represent a weight term. Further, when embodied as a DAC, the current sources assume a constant value, and the digital word appears at a specific clock rate. When used as a MAC device, each of the current sources represent an input variable, which is multiplied with the digital word as a mixed mode multiplier, and the output currents are combined to represent a sum. The fundamental difference between the DAC and the MAC functionality is in the manner the digital words are input to the hardware. In a DAC operation, the digital word appears at a clock rate, while in a MAC operation, the digital word can change asynchronously. Hence, the DAC function includes a sampling function while the MAC does not include a sampling operation.

In particular, the current-steering DAC circuit architecture 100 shown in FIG. 2A is a unary-weighted current steering DAC having an array 200 of a quantity $2^{(U)}$ of unary-weighted current sources (cells) 120, where U<<N, and U is configurable to specify the amount of current sources and where N is the DAC bit resolution, e.g., 8-bits. Thus, for example, for a configuration of N=8, U=4, current source array 200 includes four (4) identical current sources 120; and four N=8, U=2 current source array 200 includes two (2) identical current sources 120, etc.

Each identical current source 120 of the array 200 is equally unary-weighted, i.e., providing a unit current 104 of a scale of "1" as shown in FIG. 2A. Each cell 120 includes a cascode connection of transistors, e.g., PMOS transistors M1, M2, including a respective current source transistor 115 for current source matching and a cascode connected transistor 116 for providing high output impedance, where the current source transistor 115 includes source terminal connected to a fixed power supply voltage $V_{DD}$. A biasing voltage $V_B$ is provided for each current source transistor 115 and a biasing voltage $V_{BC}$ is for biasing each cascode transistor 116.

As shown in FIG. 2A, the current steering DAC 100 architecture employs a first hierarchy current scaling network or first hierarchy 201 of current splitters 125 that provides a current division operation, where a respective unary-weighted current source cell 120 of the array 200 is connected to a respective current splitter 125. That is, each current source 120 of the $2^{(U)}$ unary-weighted current sources includes a node 121 connecting to a respective current splitter 125 that provides a respective current division operation of the current received from its respective cell 120. In an embodiment, the current scaling can be binary weighted or unary weighted.

In the embodiment shown in FIG. 2A, each respective current splitter 125 includes a series of parallel-connected paired differential switching transistors 126 connected to a respective node 121, with each successive pair of differential switching transistors 126 being configured to receive a successive respective bit, $b_k$, where k=0, ..., K-1 (where K is a number depending on the DAC/MAC bit resolution. For example, a first pair of differential switching transistors 126 connected to node 121 receives a first bit (e.g., bit $b_0$) and its bit complement (e.g., bit $\overline{b_0}$) of an input digital signal (e.g., from an input 4-bit binary word, 8-bit binary word, etc.). In a binary weighted current scaling configuration, each successive pair of the parallel-connected paired differential switching transistors 126 of a current splitter 125 is binary weighted, i.e., scaled in size such that its respective amount of current drawn from its respective connected cell 120 is based on a binary weighting current division scheme determined according to its particular bit significance, e.g., from between the LSB bit position ($b_0$) to a MSB position, e.g., bit ($b_{K-1}$) in the input digital signal word.

In an embodiment, for MAC operations, a respective current splitter 125 may be associated with a different digital word to be multiplied, e.g., a first current splitter 125 connected to a first unary-weighted current source 120 is configured to receive bits of a first digital word, and a second current splitter 125 connected to a second unary-weighted current source is configured to receive bits of a second digital word, etc. Each first digital word and second digital word can be of the same bit resolution (e.g., each 4 bits or 8 bits) or be of different bit resolutions.

In an embodiment, each set of parallel connected differential-pair switching transistors 126 of a current splitter 125 includes MOS transistors (e.g., PMOS transistors) of a minimal size, e.g., on the order of 100 times smaller than a size of a unit current source transistor, where each respective differential-pair transistors receive differential input bits to a current division of a unitary weighted current 104, i.e., a unit current value, provided by its connected unary-weighted current source.

Figure 3:
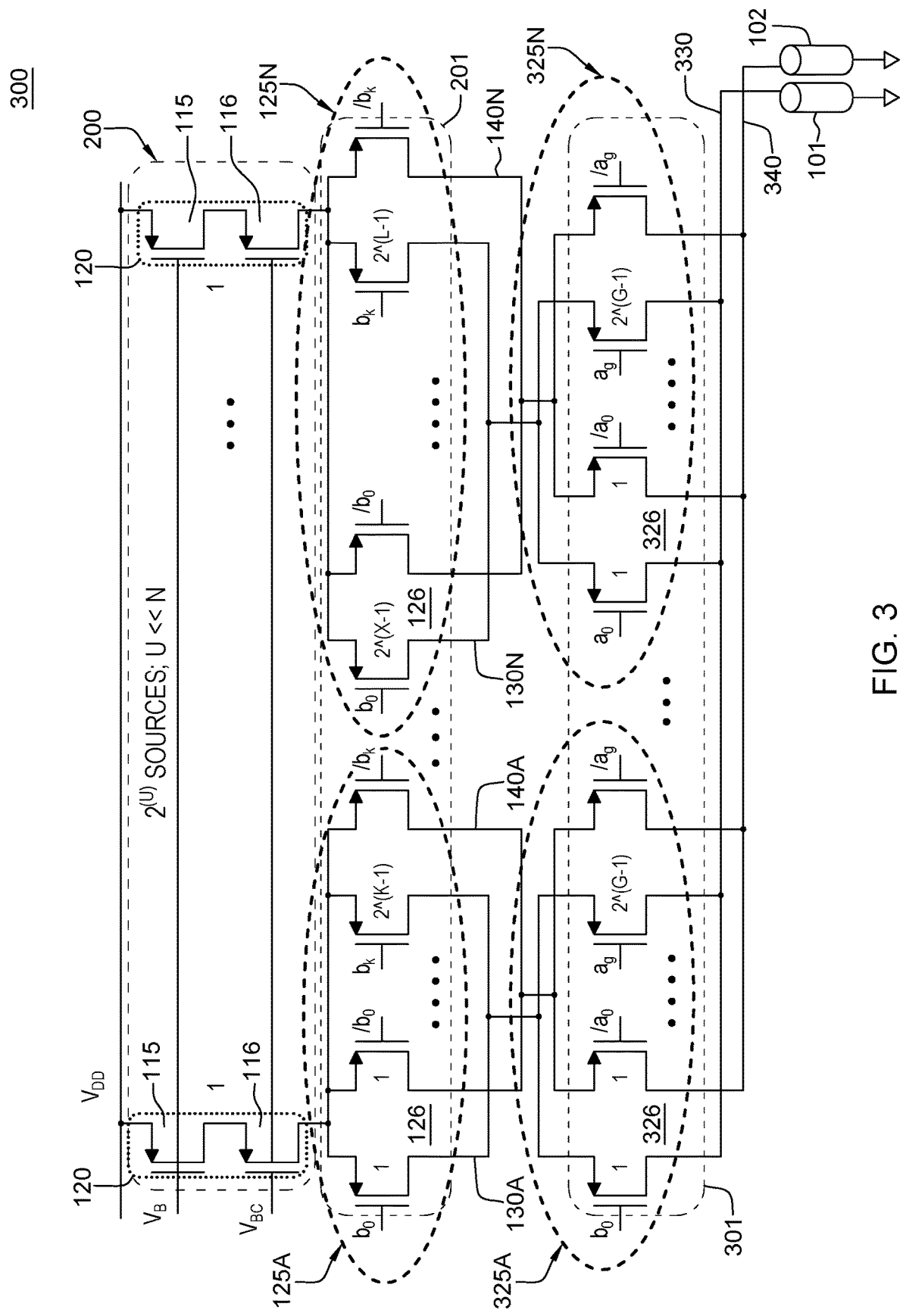
FIG. 3 depicts a circuit diagram of a low area MAC unit according to a further embodiment that includes the current steering circuit for a MAC unit as shown in FIG. 2A and further employing a hierarchical current division scheme.

In an alternate embodiment, the DAC/MAC unit 100 of FIG. 3 is configured oppositely, i.e., with a plurality of NMOS transistor current sinks (instead of PMOS current sources), such that NMOS current sink transistors receive current from a respective configuration of transistor switches situated above and the current drawn through the switches is referenced with respect to a ground potential (and not a supply voltage source).

In the embodiment depicted in FIG. 2A, connected to node 121 of first unary-weighted current source 120 is a first parallel connected set 125 of differential-pair transistors including a first binary weighted differential-pair switching transistors 126 having a unit "1" scale (i.e., weight=1) for receiving a first differential pair of input bits $b_0, \overline{b_0}$ corresponding to the least significant bits (LSB) of the input digital signal, a second binary weighted differential-pair switching transistors (not shown) having a weight=2, for receiving a second differential pair of input bits $b_1, \overline{b_1}$, a third binary weighted differential-pair switching transistors (not shown) having a weight=4, for receiving a third differential pair of input bits $b_2, \overline{b_2}$, etc. up to and including a final binary weighted differential-pair switching transistors 126 having a corresponding weighting $2^{(K-1)}$ for receiving a final differential pair of input bits $b_k, \overline{b_k}$ corresponding to a most significant bit (MSB) position. In embodiments, K is configurable and depends upon the DAC/MAC bit resolution. The size of the switching transistors 125 is much smaller than the current sources 120, leading to overall small area for the DAC/MAC implementation. Matching of the current sources becomes worse at scaled CMOS technologies, and using smaller number of current sources/sinks leads to superior performance of the DAC/MAC functions. Hence, the disclosed techniques provide superior performance as CMOS technology scales.

In embodiments, each parallel connected set 125 of differential-pair transistors 126 including a first weighted differential-pair switching transistors 126 can be radix weighted, e.g., having a weighting scale in between unary and binary, e.g., 1.5.

Generally, in the embodiment depicted in FIG. 2A, a unary-weighted current source 120 includes a parallel connected set 125 of differential-pair transistors 126 including a first binary weighted differential-pair switching transistors 126 having a weighting scale $2^{(X-1)}$ corresponding to received first differential bits $b_0$, $\bar{b}_0$ of the same (or different) digital input word and a final binary weighted differential-pair switching transistors 126 having a corresponding weighting $2^{(L-1)}$ for receiving a final differential pair of input bits $b_k$, $\bar{b}_k$ where X and L are natural numbers, e.g., X=L=1, 2, 3 ... In an example implementation, X=1 rendering the first binary weighted differential-pair switching transistors 126 receiving a first differential bits $b_0$, $\bar{b}_0$ at a unit scale (i.e., weight=1). That is, in embodiments, the starting point of the individual binary weighted differential-pair switching transistors 126 of a current splitter is always at unit scale. However, the starting unit points for each branch can be different from each other in a general case. That is, in the generic case depicted in FIG. 2A, the start point for a next current splitter can be another index.

For example, in the case of a binary DAC having plural ($=2^{(U)}$) equal sized current sources, a starting switching transistor of a current splitter branch (e.g., a branch N+1) can be equal to twice the size of the largest switch of its adjacent prior current splitter branch (e.g., a branch N). For a DAC with different radix system, the multiplier is simply given by the radix. As an example, for a radix=1.5 system on the first set of current splitters (each current source is 1.5 times the weight of a previous one, i.e., each successive source weighted according to $1.5^0$, $1.5^1$, $1.5^2$, ... etc.), and the individual segments can be binary weighted. For the binary system, i.e., the weights of the current sources become $2^0$, $2^1$, $2^2$ ... etc.

In an example, to implement an 8 bit DAC/MAC, i.e., N=8 bit DAC resolution, a current division according to 256 levels is realized with K=6. That is, with U=2, unit 100 is configured with four ($2^{(U)}=2^2=4$) equal sized current sources 120 and respective four (4) current splitters each, current splitter having six (6) binary weighted switches to implement a total of 64 current levels ($2^6$) at each of the four current splitters (i.e., U+K=N). This means the last received input bit $b_5$ (small k=5) and of a respective splitter will be received by binary weighted differential-pair switching transistors scaled to draw 32 times more current weight ($2^{(6-1)}=2^5=32$) than the weighted current drawn from differential-pair switching transistors receiving bit $b_0$ (scaled to unary weight=1). Similarly, for N=8 (bit DAC), if U=1, then K=7 (i.e., U+K=8), and unit 100 is configured with two equal sized current sources 120 with each of the two current splitters of binary weighted switches implementing 128 levels ($=2^7$). In this embodiment, the last received input bit $b_6$ (small k=6) of a respective splitter will be received by binary weighted differential-pair switching transistors scaled to draw 64 times more current weight than the weighted current drawn from differential-pair switching transistors receiving bit $b_0$ (i.e., $2^{(7-1)}=2^6=64$) at each of the two current splitters.

Further, in this example, to implement an 8 bit DAC/MAC, with four current sources 120 (U=2, K=6), as each current splitter 125 will receive six (6) digital input bits, i.e., bits $b_0$, $b_1$, ..., $b_5$ (small k=5), then for an 8-bit device resolution, the two remaining MSB bits of the 8 bit digital input word are used to select one or more of the four (4) current splitters, i.e., $4*2^6=2^2*2^6=2^P*2^K=256$ total current levels, where P+K=8, where "P" is the number of bits for selecting the current splitter.

In the example 8 bit DAC/MAC implementation where N=8, U=2, K=6, the two most significant bits MSBs of the 8-bit digital word are used to select one or more of the four current source units depending upon the values. For example, MSB values '00' of the 8 bit digital input signal are used to select only 1 current source and its corresponding splitter will receive the six (6) digital input bits, i.e., bits $b_0$, $b_1$, ..., $b_5$; MSB values '10' of the 8 bit digital input signal will select two of the four current sources and the six (6) digital input bits are received at each the two attached current splitters; MSB values '01' will select three current sources and the six (6) digital input bits are received at each of the three attached current splitters; and for MSB values '11' all four current sources are selected to each receive the six (6) digital input bits. To select the one or more of the four (4) current sources, the remaining two most significant bits (MSBs) of the 8 bit digital input signal are input to a controller, and remaining 6 LSB bits are applied to the current switching devices according to binary logic.

Similarly, in the example 8 bit DAC/MAC implementation where N=8, U=3 there are eight current sources and K=5 such that a respective current splitter would receive bits 5 bits $b_0$, $b_1$, ..., $b_4$ and thus the 3 remaining MSBs of the input digital word select among the eight current sources. In the example 8 bit DAC/MAC implementation where U=1, K=7, if the single most significant bit (MSB) of the 8-bit digital word is a value of '1' then the second of the two current sources (in addition to the first current source cell) is also selected and both will receive the seven (7) digital input bits, i.e., bits $b_0$, $b_1$, ..., $b_6$.

As shown in FIG. 2A, in an embodiment, responsive to the MSBs of the input digital word, a controller device 198 provides signals 199 to control two switches 117 that are programmed to activate the one or more of the current sources 120. In particular, there are two mechanisms of current source selection. The MSB current sources are selected by programming the gate bias voltages of the transistors. For a PMOS transistor, providing a mirroring bias voltage to the gate supplies current, and the current can be disabled by lifting up the gate voltage all the way to the $V_{DD}$ supply. For the binary switches, the current is simply steered to the left or to the right, depending on the polarity of the bit.

Thus, as shown in FIG. 2A, responsive to received MSB bits, controller 198 provides signals 199 to control the switches 117 for activating each respective current source transistor 115, 116 of a selected current source 120. For example, responsive to the MSBs, signals 199 are programmed to control one of the switches 117 in line with the gate bias voltage input ($V_B$, $V_{BC}$) and to control the other of the switches 117 to lift the gate voltage up to the supply voltage, e.g., to short circuit a gate terminal of a current source transistor 115, 116 to the $V_{DD}$ supply voltage.

In an embodiment, the controller 198 is a binary-to-thermometer decoder such that for the N=8, U=2, K=6 example implementation, 2 MSBs binary words ensure that of the four possible outcomes '00', '01', '10', '11' only one current source switches at a time, e.g., MSBs '00' decode to 0001 (to select first current source), '01' MSBs of the 8 bit digital input signal decodes to 0011 and used to switch in the second current source; '10' MSB values decode to 0111 and used to select the third current source; and MSBs '11' of the 8 bit digital input signal decodes to 1111 and used to switch in the fourth current source so only one current source is switched at a time.

Thus, each sub-array consisting of K switching elements can be also realized using fully equal size of current sources (e.g., thermometer weighted), i.e., the 256 elements can be implemented using U=4 ($2^4$=16) and in each sub-array there are 16 equally weighted elements, with the constraint that starting point of branch N+1 switches equals to twice the size of the largest switch of prior branch N.

Figure 1:
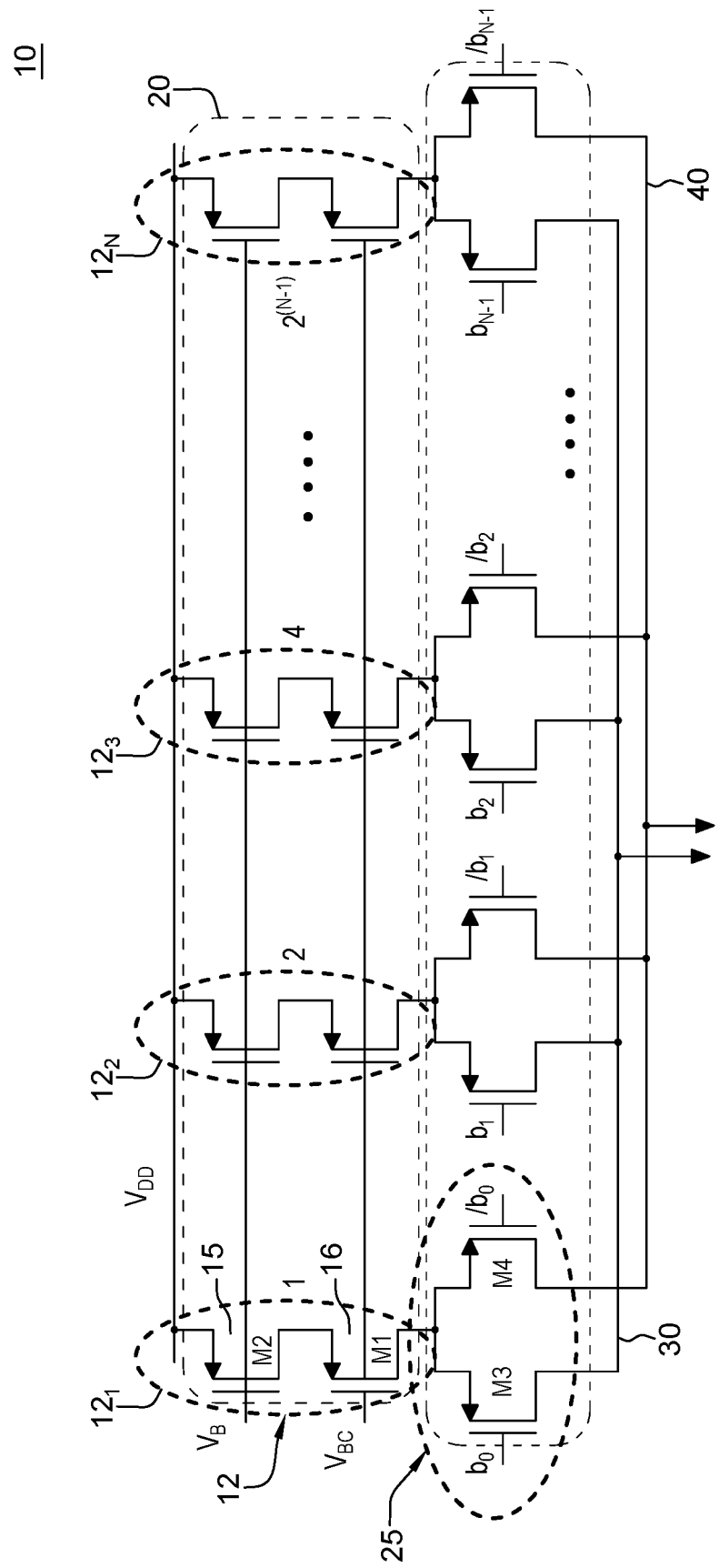
FIG. 1 is a circuit schematic depicting a binary weighted current steering unit used in conventional multiply and accumulate (MAC) unit implementations.
Figure 5:
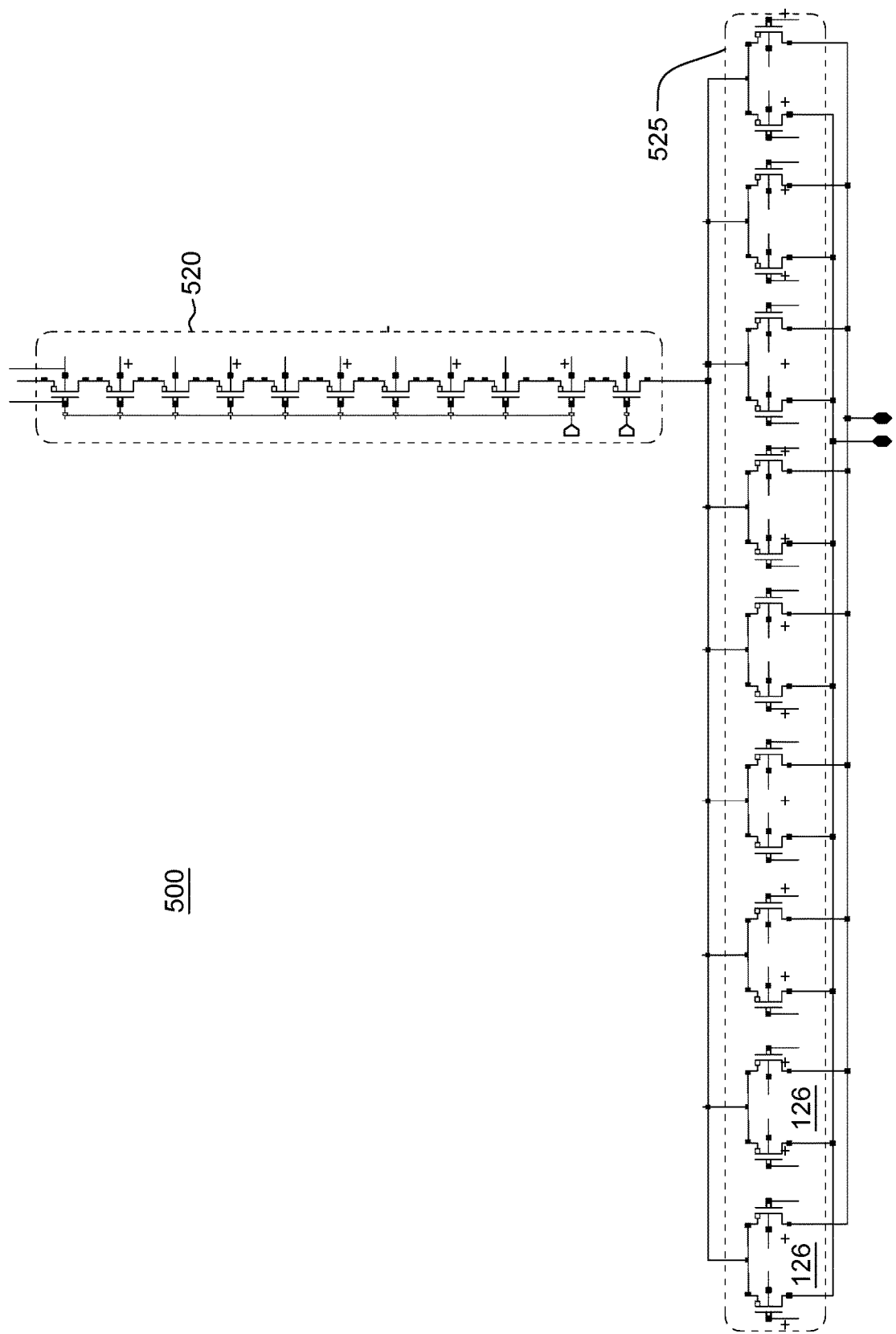
FIG. 5 depicts a semiconductor circuit diagram depicting an example circuit layout showing a cascode circuit current source and a coupled binary weighted configuration that takes up reduced integrated circuit chip area.

Generally, the choice of segmentation, i.e., number $2^{(U)}$ of current source cells 120 and connected splitters and the corresponding number of differential-pair switching transistors receiving bits at each splitter is reconfigurable by software/digital bits. The binary weighted differential switching transistors 126 of array 201 consume significantly smaller area compared to large current source arrays, thereby significantly lowering power consumption. For example, a conventional scheme in binary coding of FIG. 1 can consume power, e.g., 115 uW analog and 166 uW digital power and take up a total consumed chip area corresponding to 51.5 µm² while an equivalent circuit 200 configured as in FIG. 2A can consume less power, e.g., 115 µW analog and 60 µW digital power in a much smaller area. For example, FIG. 5 depicts a semiconductor circuit diagram 500 depicting an example circuit layout showing a unary-weighted cascode circuit current source cell 520 that takes up an integrated circuit chip area of 0.22 µm² and a coupled example binary-weighted current splitter configuration 525 of minimal-sized differential-paired switching transistors 126 that take up an integrated circuit chip area of 0.30 µm² such that a total consumed chip area is 0.55 µm² which is much less than the total consumed chip area corresponding to the equivalent circuit portion of the circuit 200 of FIG. 2A.

In a further embodiment, each of the $2^{(U)}$ current sources can be binary weighted, and each of the k=K-1 differential-pair switching transistors receiving bits at each splitter are binary weighted. In another variation, each of $2^{(U)}$ current sources are binary weighted and each of the k=K-1 differential-pair switching transistors receiving bits at each splitter are thermometer weighted.

A different radix system is also possible for a general purpose multiply and accumulate such that chip area of the current sources is reduced with very little penalty in power consumption.

As further shown in FIG. 2A, the current division provided by each respective pair(s) of parallel-connected paired differential switching transistors 126 of each splitter 125 of each activated current source converts a differential N-bit digital input signal to an analog current. The output currents from the paired differential switching transistors 126 of each splitter 125 are summed to provide an analog output current, represented as differential output currents $I_{out+}$ carried on first conductor node 130 and $I_{out-}$ carried on second conductor node 140. Each of these output conductors 130, 140 are directly coupled to a respective memory cell 101, 102 and the respective currents are input to directly program each memory cell. In an embodiment, the memory cell directly receiving an output current is a magnetic tunnel junction (MTJ) device 101, 102 of an MRAM memory (or any similar memory storage device of a non-volatile memory).

Figure 2B:
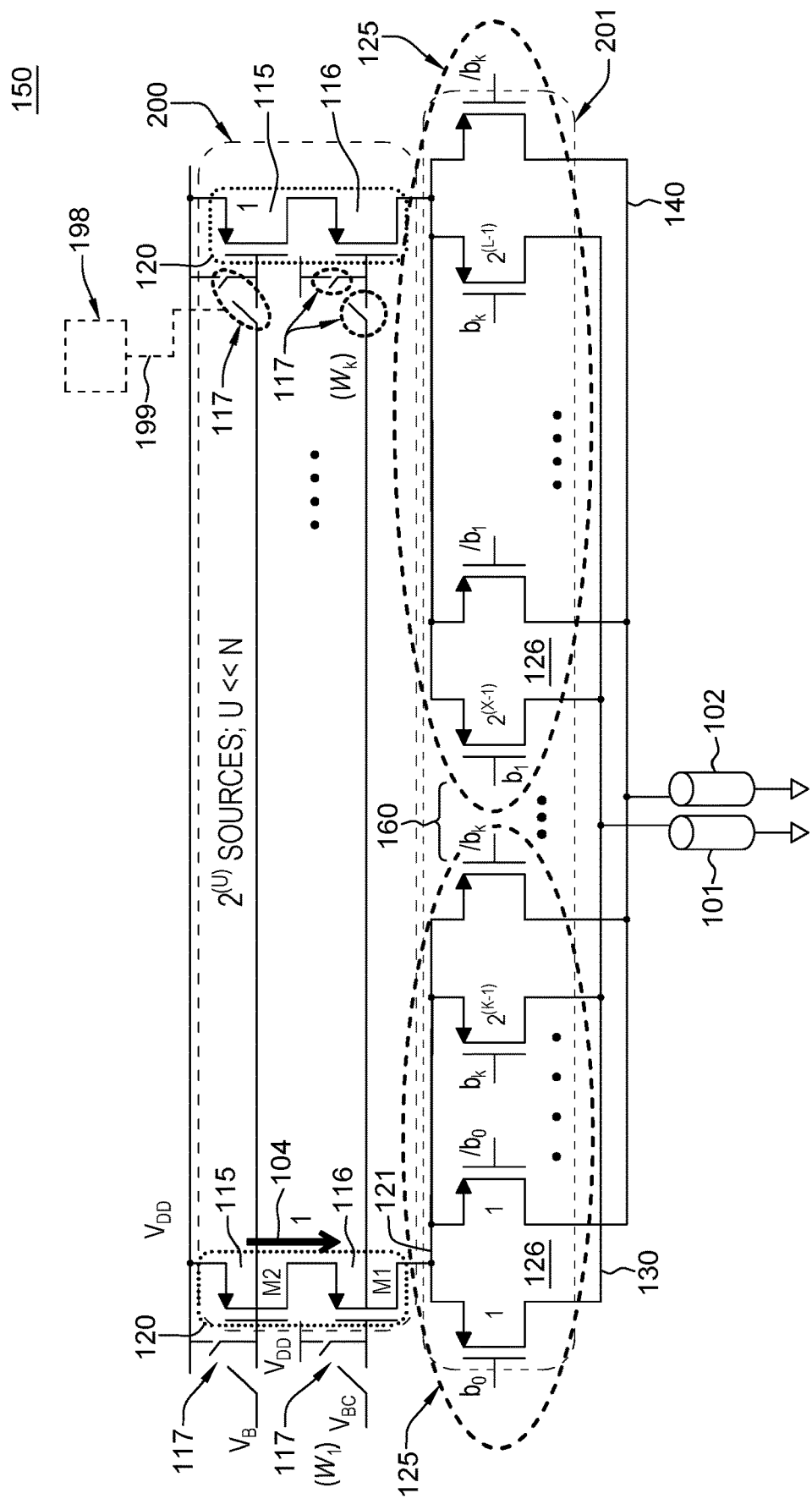
FIG. 2B depicts a multiply and accumulate (MAC) obtained by reconfiguring the MAC/DAC core of FIG. 2A to perform a MAC operation.

In a further embodiment, a multiply and accumulate (MAC) circuit 150 is illustrated in FIG. 2B which is obtained by reconfiguring the MAC/DAC core to perform a MAC operation. The multiply and accumulate functionality is realized as implementing the equation $Y=\alpha\Sigma_{k=1}^{n}w_k \cdot X_k$, where Y is the multiply and accumulate result, and $w_k$ and $X_k$ are the weight and input variables respectively, and a is a scalar quantity. In FIG. 2B, scalar quantity α represents the value of the currents flowing in the individual current sources indicated by 115. These current sources are controlled by a master current bias, which provides the gate voltage $V_B$, enabled by switches 117. The weight vector (w) is implemented by the cascode transistors 116 by controlling the gate bias voltage indicated by $V_{BC}$. For example, leftmost cascode transistor 116 illustrated in FIG. 2B provides a weight indicated as $w_1$ as controlled by a first gate bias voltage $V_{BC}$ applied through switch 117 and rightmost cascode transistor 116 illustrated in FIG. 2B provides a weight indicated as $w_k$ as controlled by the a further gate bias voltage $V_{BC}$ applied through switch 117. A respective input vector 160 ($X_1 \ldots X_k$) is implemented by the respective input digital words b[0:k]. The final result (Y) is obtained at the output of the MAC, and are available across the conductor nodes 130 and 140, and are directly stored in the memory elements 101 and 102. In this manner, the current can be shared between the MAC element and a current mode memory element, leading to low power MAC implementation.

In an alternate embodiment having a plurality of NMOS transistor current sinks (instead of PMOS current sources) receiving current from a respective configuration of transistor switches, a memory cell 101 is coupled to a terminal, e.g., a drain, of the respective NMOS transistor.

FIG. 3 depicts a low area multiply and accumulate (MAC) unit 300 according to a further embodiment that includes the current steering circuit for a MAC unit as shown in FIG. 2A that employs a fewer number of current sources 120 to provide less constraint on current matching while consuming much reduced integrated circuit area and further, provides a hierarchical current division scheme.

In particular, MAC unit 300 of FIG. 3 employs the first hierarchy current scaling network or first hierarchy 201 of current splitters 125 that provides a current division operation, where a respective unary-weighted current source cell 120 of the array 200 is connected to a respective current splitter 125 of the first hierarchy 201, and the output conductors of the 130, 140 providing the summed currents of the current splitters 125 of the first hierarchy 201 are further connected to a second hierarchy current scaling network or second hierarchy 301 of current splitters 325 that provides a further current division operation. More particularly, in the embodiment shown in FIG. 3, each respective current splitter 125A, ..., 125N of the first hierarchy 201 is connected to a corresponding further current splitter 325A, ..., 325N of the second hierarchy 301 of scaling current splitters. For example, current splitter 325A of the second hierarchy 301 includes a series of parallel-connected paired differential switching transistors 326 where a first transistor of each pair connects to summed current output conductor 130A of the current splitter 125A of the first hierarchy 201, and the second or differential switching transistor of each pair 326 is connected to summed current output conductor 140A of the current splitter 125A. Similarly, current splitter 325N of the second hierarchy 301 includes a series of parallel-connected paired differential switching transistors 326 where a first transistor of each pair connects to a summed current output conductor 130N of the current splitter 125N of the first hierarchy, and the second or differential switching transistor of each pair 326 is connected to output conductor 140N.

In the embodiment of FIG. 3, in each current splitter 325A, . . . , 325N of the second current division hierarchy, a first transistor of each successive pair of differential switching transistors 326 includes a control terminal configured to receive a successive respective bit, e.g., bits $\alpha_0$, $\alpha_1$, . . . , $\alpha_g$ and the other transistor of each successive pair its bit complement e.g., bits $\bar{\alpha}_0, \bar{\alpha}_1, \ldots, \bar{\alpha}_g$ of an input digital signal (e.g., an input 4-bit binary word, 8-bit binary word used for further amount of current division resolution desired). For example, the first hierarchy of current division using splitters 125A, . . . , 125N can achieve four bit division and the second hierarchy of current division splitters 325A, . . . , 325N can achieve two bits of further current division resolution.

In the embodiment of FIG. 3, each current splitter 325A, . . . , 325N of the second current division hierarchy 301, is configured to provide a further binary weighted current scaling configuration providing the further layer of division. In the binary weighted current scaling configuration, each successive pair of the parallel-connected paired differential switching transistors 326 of a current splitter is binary weighted, i.e., scaled in size such that its respective amount of current drawn from its respective connected output conductor is based on a binary weighting current division scheme determined according to its particular bit significance, e.g., from between the LSB bit position ($\alpha_0$) to a MSB position, e.g., bit ($\alpha_g$) in the input digital signal word of the second hierarchy.

In an embodiment, each set of parallel connected differential-pair switching transistors 326 of a current splitters 325A, . . . , 325N includes MOS transistors (e.g., PMOS transistors) of a minimal size, e.g., on the order of 100 times smaller than a size of the unit current source transistor.

In the embodiment depicted in FIG. 3, at each connected current splitter 325A, . . . , 325N connected to corresponding output current conductors 130A, . . . , 130N is a respective first parallel connected set of differential-pair transistors 326, each set including: a first binary weighted switching transistors having a unit "1" scale (i.e., weight=1) for receiving a first differential pair of input bits $\alpha_0$, $\bar{\alpha}_0$ corresponding to the least significant bits (LSB) of the input digital signal, a second binary weighted differential-pair switching transistors (not shown) having a weight=2, for receiving a second differential pair of input bits $\alpha_1$, $\bar{\alpha}_1$, a third binary weighted differential-pair switching transistors (not shown) having a weight=4, for receiving a third differential pair of input bits $\alpha_2$, $\bar{\alpha}_2$, etc. up to and including a final binary weighted differential-pair switching transistors 326 having a corresponding weighting $2^{(G-1)}$ for receiving a final differential pair of input bits $\alpha_g$, $\bar{\alpha}_g$ corresponding to a most significant bit (MSB) position. In embodiments, 'G' is configurable and depends upon the DAC/MAC bit resolution.

As further shown in FIG. 3, the further current division provided by each respective pair(s) of parallel-connected paired differential switching transistors 326 of a respective current splitter 325A, . . . , 325N converts the differential N-bit digital input signal to an analog current. The output currents from the paired differential switching transistors 326 of each splitter 325A, . . . , 325N are summed to provide an analog output current, represented as differential output currents $I_{out+}$ carried on first conductor 330 and $I_{out-}$ carried on second conductor 340. Each of these output conductors 330, 340 are directly coupled to a respective memory cell 101, 102 and the respective currents are input to directly program each memory cell. In an embodiment, the memory cell directly receiving an output current is a magnetic tunnel junction (MTJ) device 101, 102 of an MRAM memory (or any similar memory storage device of a non-volatile memory, e.g., Phase Change Memory, Resistive RAM (Re-RAM), Ferro-electric memory, etc. or volatile memory (e.g., DRAM, SRAM etc.)).

In additional embodiments, besides coupling the summed analog output currents from each current splitter of the first hierarchy current scaling network to a second current scaling network layer, further hierarchical current division layers can be configured to provide further current division of a desired bit division, e.g., summed analog output currents from each current splitter of the second hierarchy current scaling network can be respectively coupled to a further current splitter of a third hierarchy current scaling network in like manner as shown in FIG. 2A. Such an implementation of further hierarchy current scaling network levels can be used to perform vector cross-product functions.

Figure 4A:
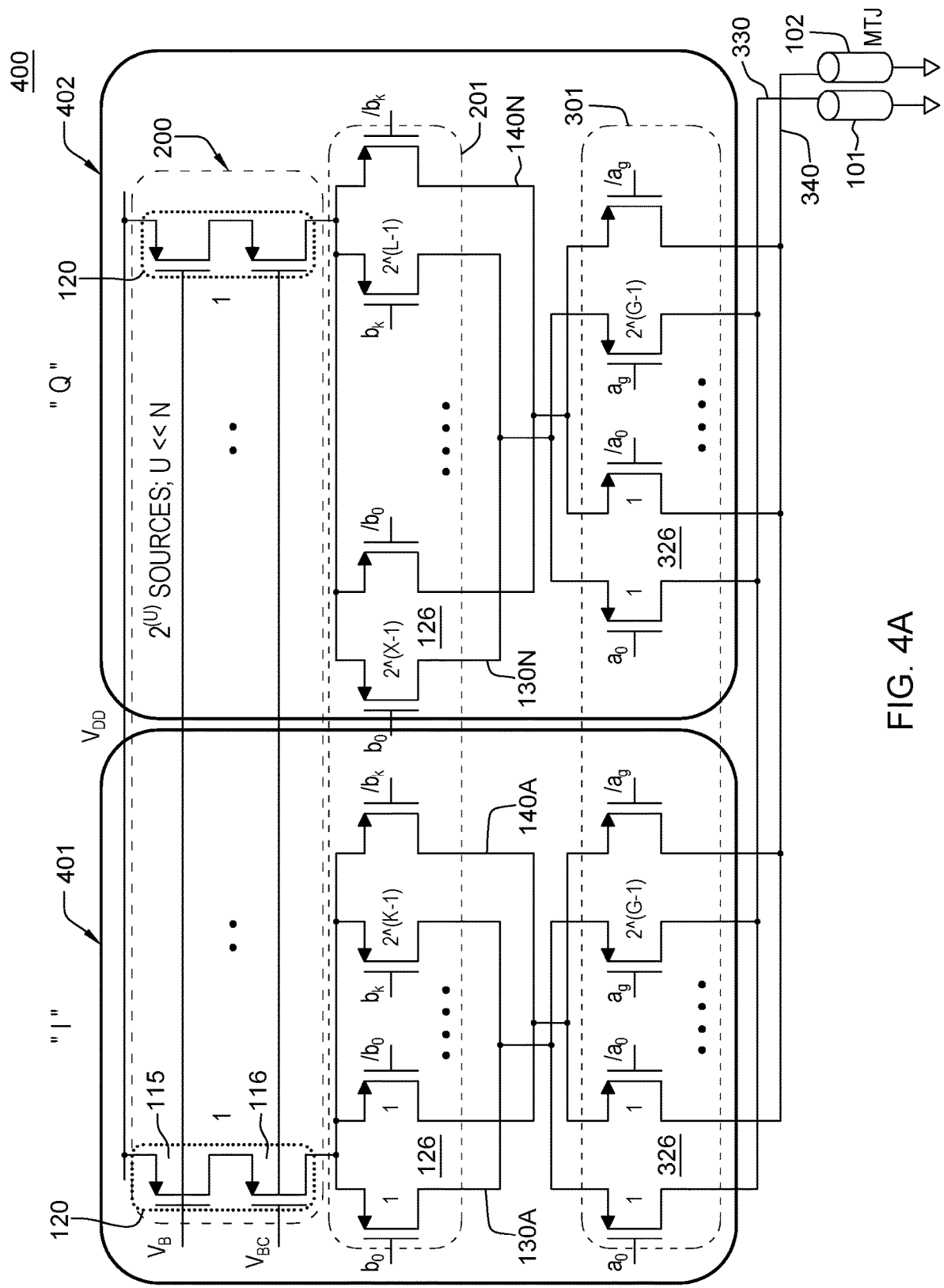
FIG. 4A depicts a low area multiply and accumulate unit according to a further embodiment that includes the current steering unit as shown in FIG. 3, however is further configured to perform vector multiplications and/or perform vector amplitude and phase modulation of input signals.

FIG. 4A depicts a low area multiply and accumulate unit according to a further embodiment that includes the current steering unit 400 for a MAC unit that employs a fewer number of unary weighted current sources 120 to provide less constraint on current matching while consuming much reduced integrated circuit area as shown in FIG. 3, however is further configured to provide a hierarchical current division scheme that employs, besides scalar multiplications, vector multiplications and/or perform vector amplitude and phase modulation. In particular, a MAC sub-unit 401 is configured with one or more current sources 120 of unary-weighted current source array 200 and their corresponding connected one or more current splitters 125 of a first hierarchy current scaling network 201, and their connected one or more respective current splitters 325 of a second hierarchy current scaling network 301 form a first vector output current for multiplication, while a second MAC sub-unit 402 having one or more current sources 120 of current source array 200 and their connected respective one or more current splitters 125 of a first hierarchy current scaling network 201, and their connected one or more respective current splitters 325 of a second hierarchy current scaling network 301 form a second orthogonal or quadrature vector output current for multiplication. Each respective vector 401, 402 provides a respective output current in the manner as described with respect to the embodiment of FIG. 3, that is summed for output as differential currents $I_{out+}$ carried on first conductor 430 and $I_{out-}$ carried on second conductor 440. Each of these output conductors 430, 440 are directly coupled to a respective memory cell 101, 102 and the respective currents are input to directly program each memory cell. In an embodiment, the memory cell directly receiving an output current is a magnetic tunnel junction (MTJ) device 101, 102 of an MRAM memory (or any similar memory storage device of a non-volatile memory).

In an example AU implementation, neuronal "weight" values such as learned by iterative flow of training in neural networks such as obtained during a network training phase can be represented using selected current sources 120, and physical variables or vectors to be multiplied can be represented by the digital words input as represented by the digital input bit representation variables $b_0, b_1, \ldots b_k$ of a first vector for multiplication and current summing at the first hierarchical current scaling layer 201 and represented by the digital input bit representation variables $\alpha_0, \alpha_1, \ldots \alpha_g$, of a second vector for multiplication and current summing at the first hierarchical current scaling layer 301.

That is, in MAC sub-units 401, 402 the current sources 120 in each are configured as the "weights" values "w" and may be hard-coded or configured in the system to provide the digital representation of the weights. A first vector to be multiplied is obtained by the current source 120 "weights" multiplied by the digital bits $b_0, b_1, \ldots b_k$ of the digital word inputs representing a first vector at the first hierarchical current division level 201 of MAC sub-units 401, 402 to provide output currents $I_{out+}$ carried on respective first conductors 130A, 130N and and $I_{out-}$ carried on respective second conductors 140A, 140N as a result of the respective multiplication and current summation operations as output at first hierarchy level 201. A second vector to be multiplied is formed using the digital bits $a_0, a_1, \ldots a_g$ of the digital word inputs representing a second vector at the second hierarchical current division level 301 of MAC sub-units 401, 402 to provide output currents $I_{out+}$ carried on first conductor 330 and $I_{out-}$ carried on second conductor 340 as a result of the respective multiplication and current summation operations as output at second hierarchy level 301.

In an example AI implementation, neuronal "weight" values such as learned by iterative flow of training in neural networks such as obtained during a network training phase can be represented using selected current sources 120, and physical variables or vectors to be multiplied can be represented by the digital words input as represented by the digital input bit representation variables $b_0, b_1, \ldots b_k$ of a first vector for multiplication and current summing at the first hierarchical current scaling network layer 201 and represented by the digital input bit representation variables $\alpha_0, \alpha_1, \ldots \alpha_g$, of a second vector for multiplication and current summing at the first hierarchical current scaling network layer 301.

Figure 4B:
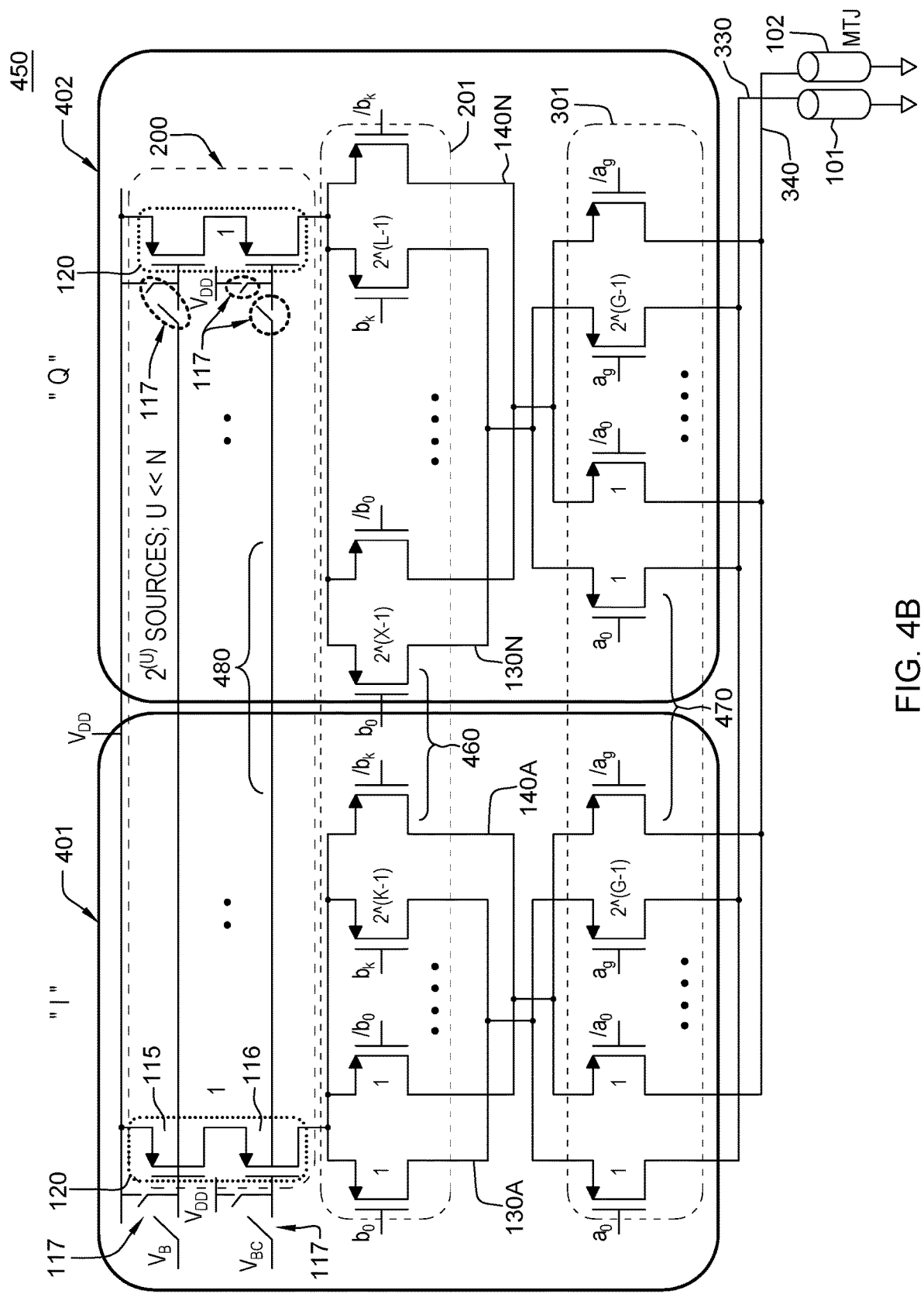
FIG. 4B depicts a multiply and accumulate (MAC) obtained by reconfiguring the MAC/DAC core of FIG. 4A to perform a MAC operation.

In a further embodiment, FIG. 4B depicts a multiply and accumulate (MAC) circuit 450 which is obtained by reconfiguring the same MAC/DAC core of FIG. 4A to perform a MAC operation. The multiply and accumulate functionality is typically realized using the equation $Y=\alpha\Sigma_{k=1}^{n} w_k \cdot X_k$, where Y is the multiply and accumulate result, and $w_k$ and $X_k$ are the weight and input variables respectively, and a is a scalar quantity. In FIG. 4B, α represents the value of the currents flowing in the individual current sources indicated by 115. These current sources are controlled by a master current bias, which provides the gate voltage $V_B$, enabled by switches 117. The weight vector (w) is implemented by reconfiguring the transistor processing elements according to an w variable array 460 in the first hierarchy current scaling network 201 using the digital word b[0:k]. The input vector (X) is provided by reconfiguring the transistor processing elements according to an X variable array 470 in second hierarchy current scaling network 301. The final result (Y) is obtained at the output of the MAC 450, and are available across the conductor nodes 330 and 340, and are directly stored in the memory elements indicated by 101 and 102. In this manner, the current can be shared between the MAC element and a current mode memory element, leading to low power MAC implementation. Another set of vectors according to an U variable array 480 is implemented by reconfiguring the current sources by reconfiguring the gate bias voltage ($V_{BC}$) to the cascode transistors 116, leading to a triple vector multiplication $Y=\alpha\Sigma_{k=1}^{n} w_k \cdot X_k \cdot U_k$.

In an example implementation, the MAC sub-unit 401 can provide an "I phase" processing to provide a "sin θ" vector representation and MAC sub-unit 402 can provide a "Q phase" processing to provide a cosin θ vector representation to perform trigonometric operations etc. related to artificial intelligence neural network applications (e.g., for dot products, gradients, convolutions, transformations, etc).

In this embodiment, the digital words of a vector input to the MAC sub-unit 402 as digital bits $b_0, b_1, \ldots b_k$ are the same or different as the digital bit values $b_0, b_1, \ldots b_3$ of the vector word inputs (e.g., j=k or j≠k) to the MAC sub-unit 401 however are delayed by a quarter phase cycle of the clock used to sequence the data input at MAC sub-unit 401. As such, a current representation of quadrature vector input is obtained at by sampling a data sequence using a data sampling clock at a time shifted (delayed) by a quarter phase (e.g., 90°) with respect to the digital words input to the respective MAC sub-unit 401 from the data sampled at a main or fundamental clock frequency. Thus, the MAC circuit 400 in the embodiment of FIG. 4A can provide at MAC sub-unit 401 an "α sin θ" vector representation and MAC sub-unit 402 can provide a "β cosin θ" vector representation for AI applications and vector amplitude and phase modulations. IN embodiment, θ is part of a MAC algorithm that is given by an AI application. For example, the AI application can imply that an image/vector needs to be processed in a 2D fashion vs. a 3D fashion, or a different compression algorithm requiring approximate computation should be used.

In a further embodiment, as shown in FIG. 4A, given a fixed total "M1" of current source cells 120 for use with the first current scaling hierarchy network 201 (for I phase processing) and given a fixed total "M2" of current source cells 120 for use with the second current scaling hierarchy network 301 (for Q phase processing), there may be a sub-total N1 out of M1 current sources elements that may be used from the first hierarchy and combined with a sub-total N2 out of M2 current sources elements from the second hierarchy to create a phase shifter function. The vector operation in conjunction of MAC/DAC operations lead to a low power phase shifter operation. For example, by combining the positive and negative components of the I and Q phases along with the current divider network, the MAC configuration can provide coverage over the entire 360° plane.

For example, for the "α sin θ" vector representation, the "α" phase vector coefficient is obtained as:

$$\alpha = N1/M1,$$

and for the "β cosin θ" vector representation the "β" phase vector coefficient is obtained as:

$$\beta = N2/M2.$$

Thus, the phase shifter is obtained as $$\theta = \arctan[(N2/M2)/(N1/M1)] = \arctan\left(\frac{\beta}{\alpha}\right).$$

For example, given a total number of current cells, e.g., 26 cells, out of a total 64 current cells 120 for I phase vector current processing, and given a total number of current cells, e.g., 39 cells, out of a total 64 current cells 120 for Q phase vector current processing, a ratio of the two current is arctan (39/26) will represent the phase shift representing the degree of mixing or summing of the I and Q phase components.

In embodiments, a phase shift relation between the I phase and Q phase vector current representation is further related to:

$$(N1/M1)^2 + (N2/M2)^2 = 1.$$

The present specification further describes a method for performing a multiply-accumulate operations wherein the MAC units 100, 300, 400 are used to perform a digital to analog conversion function or a multiplication and accumulate function and receive a number of input signals represented as sampled digital word bits $b_0$, $b_1$, ... $b_k$ and the digital input bits $\alpha_0$, $\alpha_1$, ... $\alpha_g$ whether sampled at a fundamental clocking rate or frequency or sampled at an clock phase offset from the fundamental clocking rate as applied at the multiplication engine. An MRAM memory element can store the result of such multiplication operations.

Further, in applications, a random access memory system or such volatile system memory such as dynamic random access memory (DRAM) or non-volatile magnetoresistive RAM (MRAM) system provide the memory elements receiving data bits from the multiplication engine current steering units 100, 300, 400. In the case of a MRAM memory element, an MTJ MRAM memory cell has a low latency and is thus excellent for storage, for AI/MAC computing operations as such a memory cell enables a fast readout speed, and is ideal for fast computation. Further, an MRAM cell area is very small.

Arrays of such MTJ memory elements coupled with the multiplication engine current steering units 100, 300, 400 may be used in a variety of AI applications, e.g., pattern recognition, and other applications. The multiplication engine current steering units 300, 400 can interface with a MRAM memory array and increase the efficiency of digital signal processing used to perform a multiply-accumulate (MAC) operations of/for matrix values and input vector values, e.g., perform multiply-accumulate computations for vector-matrix operations, dot product operations, filtering or Fast Fourier Transform operations of the input signals.

Figure 6:
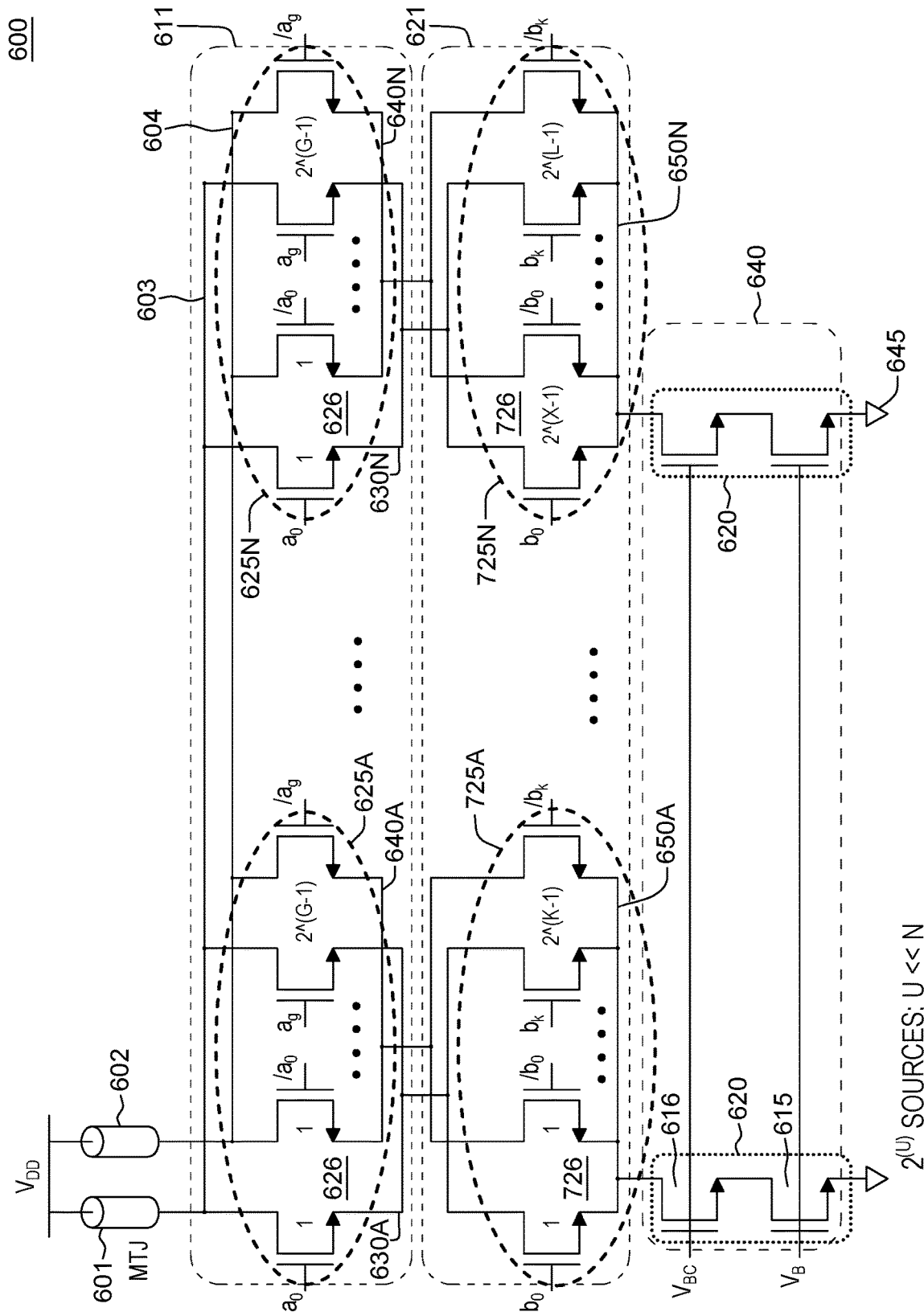
FIG. 6 depicts a low area multiply and accumulate (MAC) unit according to a further embodiment.

FIG. 6 depicts a low area multiply and accumulate (MAC) unit 600 according to a further embodiment. In the unit 600 a voltage supply (e.g., VDD) directly couples to respective memory cells 601, 602 and the voltage supply provides a respective input current flow to each for directly programming each memory cell. In an embodiment, the memory cell directly receiving an input current flow is a magnetic tunnel junction (MTJ) device 601, 602 of an MRAM memory (or any similar memory storage device of a non-volatile memory).

Through each respective memory cell 601, 602 flows a respective differential output current $I_{out+}$ carried on a directly coupled first conductor 603 from memory cell 601 and $I_{out-}$ current carried on second conductor 604 directly coupled to memory cell 602. Each differential output current $I_{out+}$ carried on first conductor 603 and $I_{out-}$ current carried on second conductor 604 is received at a first hierarchy current scaling network 611 connecting a plurality of current splitter elements 625A, ..., 625N, that each provides a current division operation.

More particularly, in the embodiment shown in FIG. 6, each respective current splitter 625A, ..., 625N of the first hierarchy 611 is series of first parallel connected differential-pair transistors 626. In the embodiment of FIG. 6, each set of differential pair transistor are differentially-paired NMOS switching transistors configured such that a first terminal of a first transistor of each differential pair 626 is connected to first conductor 603 for receiving the $I_{out+}$ current from first memory cell 601 and a corresponding first terminal of a second transistor of each differential pair 626 is connected to second conductor 604 for receiving the $I_{out-}$ current from the second memory cell 602.

In the embodiment depicted in FIG. 6, each current splitter 625A, ..., 625N of the first hierarchy 611 provides a current division (scaling) that can be binary weighted, unary weighted or weighted according to any radix system.

In the embodiment shown in FIG. 6, each respective current splitter 625A, ..., 625N includes a respective series of parallel-connected paired differential (NMOS) switching transistors 626, with each successive pair of differential switching transistors 626 configured to receive a successive respective bit, $a_g$, where g=0, ..., G−1 of an input digital word to be multiplied (where G is a number depending on the DAC/MAC bit resolution). For example, each respective gate terminal of a first pair of differential switching (NMOS) transistors 626 receives a first bit (e.g., bit $a_0$) and its bit complement (e.g., bit $\bar{a}_0$) of an input digital signal (e.g., from an input 4-bit binary word, 8-bit binary word, etc.). In a binary weighted current scaling configuration, each successive pair of the parallel-connected paired differential switching transistors 626 of a current splitter is binary weighted, i.e., scaled in size such that its respective amount of current drawn is based on a binary weighting current division scheme determined according to its particular bit significance, e.g., from between the LSB bit position ($a_0$) to a MSB position, e.g., bit ($a_g$) in the input digital signal word.

For example, at each current splitter 625A, ..., 625N, each first parallel connected differential-pair transistors 626 is a first binary weighted differential-pair (NMOS) switching transistors 626 having a unit "1" scale (i.e., weight=1) for receiving at respective gate terminal of each a first differential pair of input bits $a_0$, $\bar{a}_0$ corresponding to the least significant bits (LSB) of the input digital signal, a second binary weighted differential-pair switching transistors (not shown) having a weight=2, for receiving at respective gate terminals a second differential pair of input bits $a_1$, $\bar{a}_1$, a third binary weighted differential-pair switching transistors (not shown) having a weight=4, for receiving a third differential pair of input bits $a_2$, $\bar{a}_2$, etc. up to and including a final binary weighted differential-pair switching transistors 626 having a corresponding weighting $2^{(G-1)}$ for receiving a final differential pair of input bits $a_g$, $\bar{a}_g$ corresponding to a most significant bit (MSB) position of the input digital signal. The output differential currents of each respective current splitter 625A, ..., 625N is a differential current scaled (divided) down from the $I_{out+}$ carried on first conductor 603 and $I_{out-}$ current carried on second conductor 604.

For example, in FIG. 6, at each respective current splitter 625A, ..., 625N, each respective first transistor of each series of parallel connected binary weighted differential-pair switching transistors 626 is connected to a respective single common connected conductor 630A, ..., 630N, where each common connected conductor 630A, ..., 630N carries a respective summation of output currents from each first transistor of each respective series. Similarly, at each current splitter, each respective second transistor of each series of parallel connected binary weighted differential-pair switching transistors 626 is connected to a respective single common connected conductor 640A, . . . , 640N, where each common connected conductor 640A, . . . , 640N carries a respective summation of output currents from each second transistor of each respective series.

In an embodiment, the respective conductors 630A, 640A, . . . , 630N, 640N carrying differential currents divided down by each respective splitter 625A, . . . , 625N according to an input digital word(s) are connected to a respective current splitter 725A, . . . , 725N of a second hierarchy current scaling network 621 that provides a further level of current division according to a further input digital word(s).

That is, each corresponding further current splitter 725A, . . . , 725N of the second hierarchy current scaling network 621 connects with a corresponding current splitter 625A, . . . , 625N of the first hierarchy current scaling network 611. Thus, as shown in FIG. 6, current splitter 725A includes a series of parallel-connected paired differential switching transistors 726 where a first switching transistor of each differential-pair 726 connects output conductor 630A to receive a summed output current of the current splitter 625A of the first hierarchy 611, and the second or differential switching transistor of each pair 726 is connected to output conductor 640A to receive a summed differential output current of the current splitter 625A. Similarly, current splitter 725N of the second hierarchy 621 includes a series of parallel-connected paired differential switching transistors 726 where a first transistor of each pair connects to output conductor 630N to receive a summed output current of the current splitter 625N of the first hierarchy, and the second or differential switching transistor of each pair 726 is connected to output conductor 640N to receive a summed differential output current of the current splitter 625N.

In the embodiment depicted in FIG. 6, each connected current splitter 725A, . . . , 725N connected to corresponding output current conductors 630A, . . . , 630N includes a respective first parallel connected set of differential-pair transistors 726, each set including: a first binary weighted switching transistors having a unit "1" scale (i.e., weight=1) for receiving a first differential pair of input bits $\alpha_0$, $\overline{\alpha}_0$ corresponding to the least significant bits (LSB) of the input digital signal, a second binary weighted differential-pair switching transistors (not shown) having a weight=2, for receiving a second differential pair of input bits $\alpha_1$, $\overline{\alpha}_1$, a third binary weighted differential-pair switching transistors (not shown) having a weight=4, for receiving a third differential pair of input bits $\alpha_2$, $\overline{\alpha}_2$, etc. up to and including a final binary weighted differential-pair switching transistors 726 having a corresponding weighting $2^{(K-1)}$ for receiving a final differential pair of input bits $\alpha_g$, $\overline{\alpha}_g$ corresponding to a most significant bit (MSB) position. In embodiments, 'K' is configurable and depends upon the DAC/MAC bit resolution.

In the embodiment shown in FIG. 6, each respective current splitter 725A, . . . , 725N includes a respective series of parallel-connected paired differential (NMOS) switching transistors 726, with each successive pair of differential switching transistors 626 configured to receive a successive respective bit, $b_k$, where k=0, . . . , K−1 of an input digital word to be multiplied (where K is a number depending on the DAC/MAC bit resolution). For example, each respective gate terminal of a first pair of differential switching (NMOS) transistors 726 receives a first bit (e.g., bit $b_0$) and its bit complement (e.g., bit $\overline{b}_0$) of an input digital signal (e.g., from an input 4-bit binary word, 8-bit binary word, etc.). In a binary weighted current scaling configuration, each successive pair of the parallel-connected paired differential switching transistors 726 of a current splitter is binary weighted, i.e., scaled in size such that its respective amount of current drawn is based on a binary weighting current division scheme determined according to its particular bit significance, e.g., from between the LSB bit position ($b_0$) to a MSB position, e.g., bit ($b_g$) in the input digital signal word.

For example, at each current splitter 725A, . . . , 725N, each first parallel connected differential-pair transistors 626 is a first binary weighted differential-pair (NMOS) switching transistors 626 having a unit "1" scal (i.e., weight=1) for receiving at respective gate terminal of each a first differential pair of input bits $b_0$, $\overline{b}_0$ corresponding to the least significant bits (LSB) of the input digital signal, a second binary weighted differential-pair switching transistors (not shown) having a weight=2, for receiving at respective gate terminals a second differential pair of input bits $b_1$, $\overline{b}_1$, a third binary weighted differential-pair switching transistors (not shown) having a weight=4, for receiving a third differential pair of input bits $b_2$, $\overline{b}_2$, etc. up to and including a final binary weighted differential-pair switching transistors 726 having a corresponding weighting $2^{(K-1)}$ for receiving a final differential pair of input bits $b_k$, $\overline{b}_k$ corresponding to a most significant bit (MSB) position of the input digital signal. The output differential currents of each respective current splitter 725A, . . . , 725N is a differential current scaled (divided) down from the $I_{out+}$ carried on respective conductors 603A, . . . 603N and $I_{out-}$ current carried on respective conductors 604N, . . . , 604N.

Generally, as shown at splitter 725N a parallel connected set of differential-pair NMOS switching transistors includes a first binary weighted differential-pair switching transistors 726 having a weighting scale $2^{(X-1)}$ corresponding to received first differential bits $b_0$, $\overline{b}_0$ of the same (or different) digital input word and a final binary weighted differential-pair NMOS switching transistors 726 having a corresponding weighting $2^{(L-1)}$ for receiving a final differential pair of input bits $b_k$, $\overline{b}_k$ where X and L are natural numbers, e.g., X=L=1, 2, 3 . . . In an example implementation, X=1 rendering the first binary weighted differential-pair switching transistors 726 receiving a first differential bits $b_0$, $\overline{b}_0$ at a unit scale (i.e., weight=1). That is, in embodiments, the starting point of the individual binary weighted differential-pair switching transistors 726 of a current splitter is always at unit scale. However, the starting unit points for each branch can be different from each other in a general case. That is, as in the generic case depicted in FIGS. 2, 3, the start point for a next current splitter can be another index.

As further shown in FIG. 6, differential outputs at each respective pair(s) of parallel-connected paired differential switching (NMOS) transistors 726 of a respective current splitter 725A, . . . , 725N are connected together by a respective current carrying conductor 650A, . . . , 650N. Thus, each respective output conductor 650A, . . . , 650N carries analog current generated at a respective splitter 725A, . . . , 725N, the analog current being a summed current generated by the respective splitter. Each respective output conductor 650A, . . . , 650N is physically connected to a respective current sink or current carrying element 620.

In particular, the current-steering circuit architecture 600 shown in FIG. 6 includes an array 640 of a quantity $2^{(U)}$ of unary-weighted current sinks (cells) 620, where U<<N, and U is configurable to specify the amount of current sinks and where N is the DAC/MAC bit resolution, e.g., 8-bits. Thus, for example, for a configuration of N=8, U=4, current sink array 640 includes four (4) identical current sink elements 620; and four N=8, U=2 current sink array 640 includes two (2) identical current sinks 620, etc.

In one embodiment, each identical current sink element 620 of the array 640 is equally unary-weighted, i.e., sinking a unit current of a scale of "1". Each current sink element 620 includes a cascode connection of NMOS transistors, including a respective current sink transistor 615 for current source matching and a cascode connected transistor 616 for providing high output impedance, where the current source transistor 615 includes source terminal connected to a ground reference 645. A biasing voltage $V_B$ is provided for each current source transistor 615 and a biasing voltage $V_{BC}$ is for biasing each cascode-connected transistor 616.

Thus, in operation, MTJ elements 601, 602 will store a result of a current flow path from VDD to ground modified by respective analog current division and accumulation operations at first hierarchy current scaling network 611 as scaled (divided) in accordance with input digital words, e.g., the digital words input as represented by the digital input bits $\alpha_0, \alpha_1, \ldots \alpha_g$, and operations at second hierarchy current scaling network 621 as scaled in accordance with input digital words, e.g., the digital words input as represented by the digital input bits of an input digital word and bits $b_0, b_1, \ldots b_k$.

In embodiments, the first scaling network 611 is optional and the memory elements 601, 602 can directly connect to the current splitters of the second hierarchy current scaling network 621. Further, in embodiments, additional current scaling network layers having current splitters may be added to provide further levels of current division.

Moreover, the DAC//MAC unit 600 of FIG. 6 is configurable to provide vector multiplication operations, vector-matrix operations, phase shifting operations and amplitude/phase modulation for AI applications as in the embodiments described hereinabove with respect to FIGS. 2B, 3, 4A and 4B.

As in the above-described embodiments, the size of the switching transistors 625 is much smaller than the current sink elements 620, leading to overall small area for the DAC/MAC implementation. Matching of the current sources becomes worse at scaled CMOS technologies, and using smaller number of current sources/sinks leads to superior performance of the DAC/MAC functions. Hence, the disclosed techniques provide superior performance as CMOS technology scales.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An electronic device comprising:
a plurality of current carrying elements, each current carrying element of a uniform size to each provide a matched current output;
one or more current splitters, a current splitter coupled to one current carrying element of said plurality for receiving a matched current output from its coupled current carrying element, each current splitter comprising a series of weighted switching transistor structures, each respective weighted switching transistor of the series configured for dividing current received from its coupled current carrying element according to a weighting scheme, a respective weighted switching transistor of the series further receiving a respective bit of an input digital word to be multiplied, the respective bit of the input digital word controlling a current flow at a respective path of that respective weighted switching transistor from an input current carrying element; and
an output conductor connected to an output of each weighted switching transistor of the series for accumulating each current flow output of a respective path of the series of weighted switching transistors of the current splitter as controlled by the respective input digital word bits, the accumulated current flow output representing an analog current representation of a multiply and accumulate result.

2. The electronic device of claim 1, further comprising; a non-volatile memory storage element or volatile memory storage element coupled to the output conductor for receiving and storing said analog current representation of the multiply and accumulate result.

3. The electronic device of claim 2, wherein said memory storage element is one of an MRAM, PCM or ReRAM memory storage cell.

4. The electronic device of claim 1, wherein the weighting scheme is a binary weighting scheme such that each successive switching transistor of the current splitter is sized to provide divide input current according to $2^k$, where k is a whole number representing a bit position of the input digital word being multiplied.

5. The electronic device of claim 1, wherein the weighting scheme is a different radix other than binary weighting.

6. The electronic device of claim 1, comprising first and second current splitters coupled with respective first and second matched current carrying elements, the first current splitter having a first series of weighted switching transistor structures receiving a first input digital word to be multiplied and the second current splitter having a second series of weighted switching transistor structures receiving a second input digital word to be multiplied,
each respective weighted switching transistor of the first series configured for dividing current received from its coupled current carrying element according to the weighting scheme to provide a first multiplication path current flow output of said first current splitter, and
each respective weighted switching transistor of the second series configured for dividing current received from its coupled current carrying element according to the weighting scheme to provide a second multiplication path current flow output of said second current splitter, and
the output conductor connected to sum the first multiplication path current flow output and said second multiplication path current flow output of each respective first and second current splitter.

7. The electronic device of claim 6, wherein said first input digital word to be multiplied and said second input digital word to be multiplied comprise are of a same bit resolution or different bit resolutions.

8. The electronic device of claim 4, wherein the input digital word is programmed to receive a N-bit resolution digital word, said electronic device configured with a quantity $2^U$ matched current carrying elements, wherein a number of weighted switching transistor structures in a series of a current splitter includes a number K of binary weighted switches, where U+K=N.

9. The electronic device of claim 8, wherein K<N, said electronic device further comprising: a control device receiving a quantity N−K excess digital bits of said received input digital word, said controller responding to said excess digital bits for selecting and activating additional one or more said $2^U$ matched current carrying elements.

10. The electronic device of claim 9, further comprising a switch device associated with each said $2^U$ matched current carrying elements, an associated switch device receiving a control signal for activating or de-activating one or more said $2^U$ matched current carrying elements responsive to said excess digital bits.

11. An electronic device comprising:
a plurality of current carrying elements, each current carrying element of a uniform size to each provide a matched current output;
a first current splitter and a second current splitter each first and second current splitter coupled with respective first matched current carrying element and a second matched current carrying element, the first and second current splitters comprising a first hierarchy current scaling network, the first current splitter having a first series of weighted switching transistor structures receiving a first input digital word to be multiplied and the second current splitter having a second series of weighted switching transistor structures receiving a second input digital word to be multiplied,
each respective weighted switching transistor of the first series configured for dividing current received from its coupled current carrying element according to a weighting scheme to provide a first multiplication path current flow output of said first current splitter, and each respective weighted switching transistor of the second series configured for dividing current received from its coupled current carrying element according to the weighting scheme to provide a second multiplication path current flow output of said second current splitter;
a first output conductor receiving the first multiplication path current flow output;
a second output conductor receiving the second multiplication path current flow output; and
a second hierarchy current scaling network connected to the first hierarchy current scaling network, said second hierarchy current scaling network comprising:
third and fourth current splitters, the third current splitter coupled with said first output conductor, and said fourth current splitter coupled with said second output conductor.

12. The electronic device of claim 11, wherein the third current splitter of said second hierarchy current scaling network comprises:
a third first series of weighted switching transistor structures receiving a third input digital word to be multiplied, and the fourth current splitter of said second hierarchy current scaling network comprises:
a fourth first series of weighted switching transistor structures receiving a third input digital word to be multiplied,
wherein said first multiplication path current flow output at said first output conductor is further divided according to the received third input digital input word, and said second multiplication path current flow output at said second output conductor is further divided according to the received fourth input digital word.

13. The electronic device of claim 12, further comprising: a further output conductor, said further output conductor providing a summed analog output current comprising:

a third multiplication path current flow output of said third current splitter resulting from a further dividing of said first multiplication path current flow output according to the received third input digital word, and
a fourth multiplication path current flow output of said fourth current splitter resulting from a further dividing of said second multiplication path current flow output according to the received fourth digital input word; and
a memory storage element coupled to the further output conductor for receiving and storing said summed analog output current.

14. The electronic device of claim 13, wherein the weighting scheme is one of:
a binary weighting scheme such that each successive weighted switching transistor of a respective first current splitter, second current splitter, third current splitter and fourth current splitter is sized to provide divide input current according to $2^k$, where k is a whole number representing a bit position of a respective first, second, third, and fourth input digital word being multiplied; or
is a different radix weighting scheme that is other than binary weighting.

15. The electronic device of claim 13, wherein the third input digital word at said third current splitter is of a same or different bit resolution as said first input digital word at said first current splitter; and said fourth input digital word at said fourth current splitter is of a same or different bit resolution as said second input digital word at said second current splitter.

16. The electronic device of claim 11, wherein the second input digital word to said second current splitter of said first hierarchy current scaling network is a delayed version of said first input digital word to said first current splitter of said first hierarchy current scaling network,
wherein the first input digital word and second input digital word is obtained from a data sampled according to a clock frequency, said first input digital word comprising a sampled sequence at a rate according to a fundamental clock frequency and said second input digital word comprising a sampled sequence delayed by a quarter phase relative to said fundamental clock frequency.

17. The electronic device of claim 15, wherein the first input digital word and second input digital word at respective first and second current splitters of said first hierarchy current scaling network represent a first vector quantity to be multiplied; and
the third input digital word and fourth input digital word at respective third and fourth current splitters of said second hierarchy current scaling network represent a second vector quantity to be multiplied, wherein the summed analog output current at said further output conductor comprising an analog current representation of a multiplication result of said first vector and second vector quantities.

18. The electronic device of claim 17, wherein the plurality of current carrying elements are configured to provide a respective weight value for use in a multiplication of said first vector and second vector quantities.

19. The electronic device of claim 17, wherein
said first and second current splitters receiving respective first input digital word and second input digital word at said first hierarchy current scaling network receive current from a first subset of a first total amount of first current carrying elements sourcing current to said first and second current splitters, and said third and fourth current splitters receiving said third input digital word and fourth input digital word at said second hierarchy current scaling network receive current from a second subset of a second total amount of second current carrying elements sourcing current to said third and fourth current splitters, and a ratio comprising a number of said second subset of said second amount of current carrying elements over a number of said first subset of said first amount of current carrying elements represent a phase shift angle.

20. The electronic device of claim 19, wherein a ratio of a number of said first subset of first current carrying elements over a number of said first total amount of first current carrying elements provide a first coefficient value for a trigonometric sin $\theta$ vector represented by first and second input digital words; and a ratio of a number of said second subset of second current carrying elements over a number of said second total amount of second current carrying elements provide a second coefficient value for a trigonometric cosine $\theta$ vector represented by third and fourth input digital words.

\* \* \* \* \*